(12) United States Patent
Little

(10) Patent No.: US 11,178,482 B2
(45) Date of Patent: Nov. 16, 2021

(54) TRANSDUCER MODULE AND ELECTRONICS DEVICE

(71) Applicant: Goertek Inc., Shandong (CN)

(72) Inventor: Richard Warren Little, Shandong (CN)

(73) Assignee: Goertek Inc., Weifang (CN)

( * ) Notice: Subject to any disclaimer, the term of this patent is extended or adjusted under 35 U.S.C. 154(b) by 0 days.

(21) Appl. No.: 16/935,430

(22) Filed: Jul. 22, 2020

(65) Prior Publication Data

US 2021/0029445 A1 Jan. 28, 2021

Related U.S. Application Data

(60) Provisional application No. 62/878,845, filed on Jul. 26, 2019.

(51) Int. Cl.
*H04R 1/02* (2006.01)
*H04R 1/28* (2006.01)
*H05K 7/20* (2006.01)

(52) U.S. Cl.
CPC .......... *H04R 1/2826* (2013.01); *H04R 1/023* (2013.01); *H05K 7/20127* (2013.01)

(58) Field of Classification Search
CPC . H04R 1/00; H04R 1/02; H04R 1/023; H04R 1/028; H04R 1/28; H04R 1/2807; H04R 1/2823; H04R 1/2826; H04R 1/2846; H04R 1/2849; H05K 7/20; H05K 7/20127
See application file for complete search history.

(56) References Cited

U.S. PATENT DOCUMENTS

| 8,594,351 B2 * | 11/2013 | Harlow | H04R 1/2849 381/309 |
| 2007/0206830 A1 * | 9/2007 | Usuki | H04R 9/025 381/412 |
| 2012/0217087 A1 * | 8/2012 | Ambrose | H04R 1/1091 181/130 |
| 2019/0253805 A1 * | 8/2019 | Wakeland | H04R 1/2826 |

FOREIGN PATENT DOCUMENTS

CN 203273823 U * 11/2013 ............. F21V 29/63

* cited by examiner

*Primary Examiner* — Thang V Tran
(74) *Attorney, Agent, or Firm* — Baker Botts, LLP

(57) ABSTRACT

A transducer module and electronics device are disclosed. The transducer module comprises: a transducer member; and a housing, wherein the transducer member and the housing form a cavity, and at least two venting holes are provided in the housing and communicate the cavity with outside.

9 Claims, 2 Drawing Sheets

TRANSDUCER MODULE AND ELECTRONICS DEVICE

CROSS-REFERENCE TO RELATED APPLICATION

This application claims priority to US Provisional Utility Patent Application No. 62/878,845, filed on Jul. 26, 2019, which is hereby incorporated by reference in its entirety.

FIELD OF THE INVENTION

The present invention relates to the technical field of transducer, and more specifically, to a transducer module and an electronics device.

BACKGROUND OF THE INVENTION

A transducer is a device that converts energy from one form to another. Usually a transducer converts a signal in one form of energy to a signal in another.

A transducer can be made in a form of a transducer module. A manufacturer of an electronics device can assemble the transducer module into the electronics device during manufacture.

A speaker module is a kind of transducer module. The diaphragm of the speaker module can convert electronic signal into sound wave. FIG. 1 shows a schematic top view of an electronics device comprising a speaker module.

As shown in FIG. 1, the electronics device 1 includes a speaker module 2, a processing module 4 and heat sinks 5. The speaker module 1 includes a transducer member 3. The transducer member 3 is, for example, a diaphragm. The processing module 4 may include connectivity components, decoder components, processor and so on. For example, the processing module 4 can receiver audio data through connectivity components such as WiFi component. The audio data is decoded by the decoder components and is processed by the processor. Then, the processed audio data is sent to the speaker module 2 and is played out.

The speaker module 2 usually has only one barometric venting hole V. The environment air pressure may change during shipment or usage of the speaker module. For example, when speaker modules are transported in an airplane cabin, the outer air pressure may drop dramatically. The barometric venting hole V can equilibrate the air pressure inside the back cavity of the speaker module and the air pressure outside the speaker module, so as to avoid damage to the speaker diaphragm 3.

In order to avoid measurable impacts to acoustic performance, the barometric venting hole V is generally designed to be very small and is generally less than 0.8 mm, to avoid and to prevent audible sounds of air moving through the venting hole at high speeds.

SUMMARY OF THE INVENTION

One object of this disclosure is to provide a new technical solution for transducer module.

According to a first aspect of this disclosure, a transducer module is provided, which comprises: a transducer member; and a housing, wherein the transducer member and the housing form a cavity, and at least two venting holes are provided in the housing and communicate the cavity with outside.

According to a first aspect of this disclosure, an electronics device is provided, which comprises: the transducer module according to an embodiment.

According to an embodiment of this disclosure, a performance of a transducer module can be improved.

Further features of the present invention and advantages thereof will become apparent from the following detailed description of exemplary embodiments according to the present invention with reference to the attached drawings.

BRIEF DESCRIPTION OF THE DRAWINGS

The accompanying drawings, which are incorporated in and constitute a part of the specification, illustrate embodiments of the invention and, together with the description thereof, serve to explain the principles of the invention.

DETAILED DESCRIPTION OF THE EMBODIMENTS

Figure 1:
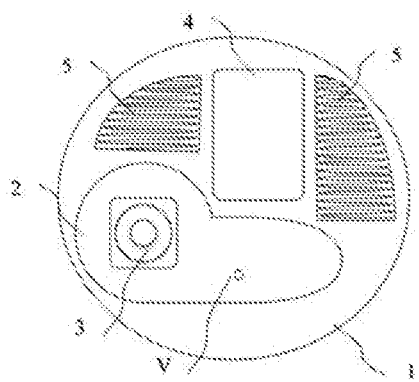
FIG. 1 shows a schematic top view of an electronics device comprising a speaker module.

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed for following figures.

Figure 2:
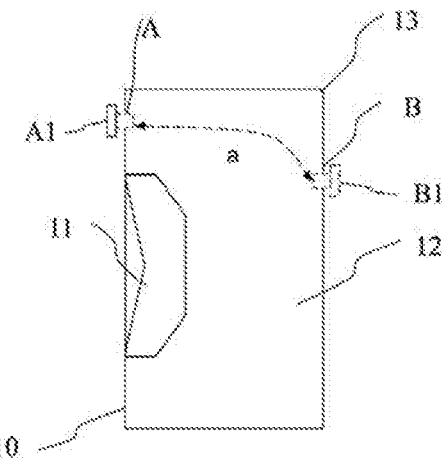
FIG. 2 shows a schematic diagram of a transducer module according to an embodiment this disclosure.
Figure 3:
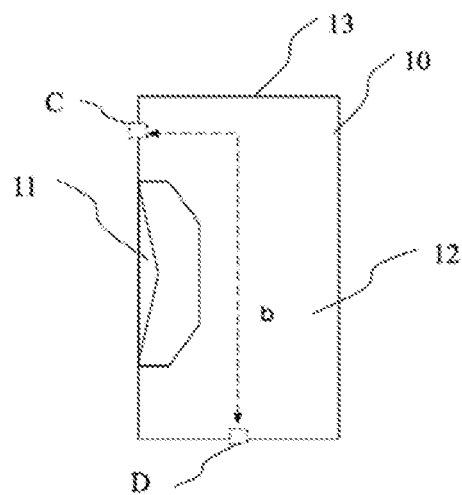
FIG. 3 shows a schematic diagram of a transducer module according to another embodiment this disclosure.
Figure 4:
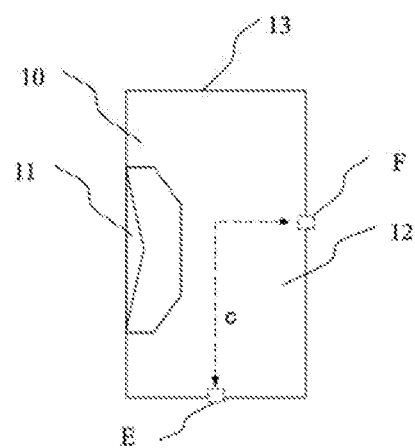
FIG. 4 shows a schematic diagram of a transducer module according to still another embodiment this disclosure.

FIGS. 2-4 show schematic diagrams of various transducer modules according to embodiments of this disclosure.

As shown in FIGS. 2-4, the transducer module 10 comprises a transducer member 11 and a housing 13. The transducer member 11 and the housing 13 form a cavity 12. At least two venting holes A, B, C, D are provided in the housing 13 and communicate the cavity 12 with outside.

The transducer module 10 may be a speaker module or a microphone module, for example. In a case where the transducer module 10 is a speaker module, the transducer member 11 is a diaphragm of the speaker module. The cavity 12 may be a back cavity of the speaker module 10 enclosed by the diaphragm 11 and the housing 13.

As explained above, a transducer module may experience air pressure change during shipments and/or usage. In addition, during operation, a transducer member can generate a lot of heat, which is dissipated inside the transducer module. Heating air in a fixed air volume will result in an increase in air pressure inside the transducer module. For example, according to the Ideal Gas Law, PV=nRT, wherein P is the pressure of the gas, V is the volume of the gas, n is the amount of substance of the gas, R is ideal gas constant and T is the temperature of the gas. The equilibrate allow for equilibrating the air pressures inside and outside the cavity 12, to avoid damages to the transducer member.

If there is only one venting hole, the heat dissipation and pressure equilibration through the only venting hole operate through air diffusion mechanisms.

Here, by providing at least two venting holes, an air current can be set up, which will equilibrate the air pressures inside and outside the cavity 12 while cooling the inside of the cavity 12. This may further reduce the impact of heat on the performance of the transducer member, have some improvement for internal cooling purposes. The at least two venting holes can act as a chimney system, for cooling the air inside the transducer module.

As shown in FIG. 2, a first venting hole A is provided at a surface of the transducer module 10 at which surface the transducer member 11 is placed, and a second venting hole B is provided at a surface of the transducer module 10 which is opposite to a surface where the transducer module 11 is placed. The air current may be set up as indicated by the dash line a.

The transducer module 10 may be a speaker module and the transducer member 11 may be a diaphragm of the speaker module. During operation, the vibration of the transducer member 11 will help the set-up of the internal air current. In addition, the transducer member 11 such as a diaphragm will generally communicate with outside to receive sound wave. In this regard, the first venting hole A may be in direct communication with the outside fresh air and thus improve the venting effect.

At least one venting hole may be covered by a mesh B1. This can prevent the venting hole from being blocked by dust. In addition, it may reduce impact of abrupt air flow on the performance of the transducer module.

Likewise, at least one venting hole may be provided with a shelter A1, which prevents the venting hole from direct communication with outside. The shelter A1 may prevent too strong venting air flow and thus reduce the impact of the venting on the performance of a speaker module.

As shown in FIG. 2, the venting holes A and B are displaced on a projection plane containing the surface where one of the two venting holes is located. That is, the projection of venting hole A on the surface where venting hole B is located is displaced from the position of venting hole B, through this arrangement, a too strong venting air flow may be avoid while the path of the air flow inside the cavity 12. On one hand, this can prevent the impact of strong air flow to the performance of the transducer module; on the other hand, the longer air flow path can take more heat out of the cavity.

FIG. 3 shows a schematic diagram of a transducer module according to another embodiment this disclosure. As shown in FIG. 3, the first venting hole C is provided on a side wall of the cavity 12 while the second venting hole D is provided on the surface where the transducer member 11 is located. The dash line b shows the air flow path inside the cavity 12. This can lengthen the air flow path inside the cavity 12. As such, the heat dispersion performance may be improved.

FIG. 4 shows a schematic diagram of a transducer module according to still another embodiment this disclosure. As shown in FIG. 4, the first venting hole E is provided on a side wall of the cavity 12 while the second venting hole F is provided on the surface opposite to the surface where the transducer member 11 is located. The dash line c shows the air flow path inside the cavity 12. This can lengthen the air flow path inside the cavity 12. As such, the heat dispersion performance may be improved. In addition, as shown in FIG. 4, the second venting hole F is opposite to the transducer member 11, so that the vibration of the transducer member 11 will help the venting of the air flow between venting holes E and F.

Figure 5:
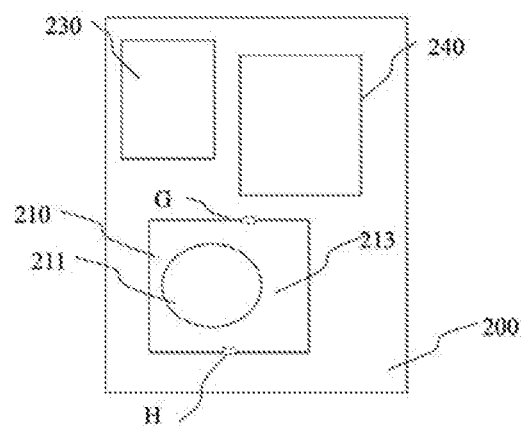
FIG. 5 shows a schematic diagram of electronics device according to an embodiment this disclosure.

FIG. 5 shows a schematic diagram of electronics device according to an embodiment this disclosure.

As shown in FIG. 5, the electronics device 200 comprises a transducer module 210. The transducer module 210 may be that as described above.

The electronics device 200 may be a portable smart sound box, a portable smart projector, a computer and so on. It could also be a display device. The display member of the display device may be the thermal generating source and thus may have severer impact on the transducer. The solution disclosed here will reduce such an impact and improve the performance of the transducer module.

The electronics device 200 further comprises a heat sink 240 and a heat generation component 230 arranged near the heat sink 240.

The transducer module 210 includes a transducer member 211 and a housing 213. The first venting hole G is placed towards the heat sink 240. During the operation of the electronics device 200, the heat sink 240 has a higher temperature than other component. It will suck the air out of the cavity of the transducer module 210.

As shown in FIG. 5, the first venting hole G is provided at a top surface of the transducer module 210, and a second venting hole H is provided at a bottom surface of the transducer module 210. The heat sink 240 is on the top side of the transducer module 210 so that the temperature at the first venting hole G is higher than that at the second venting hole H. The air current inside the transducer module 210 will run from the second venting hole H to the second first venting hole G. This arrangement will help the flow of air inside the transducer module.

As such, the heat sink 240 may also be used to cool the transducer module 210.

Although some specific embodiments of the present invention have been demonstrated in detail with examples, it should be understood by a person skilled in the art that the above examples are only intended to be illustrative but not to limit the scope of the present invention.

What is claimed is:

1. A transducer module, comprising:
a transducer member; and
a housing,
wherein the transducer member and the housing form a back cavity, and at least two venting holes are provided in the housing and communicate the back cavity with an outside space,
wherein the housing comprises a first surface at which surface the transducer member is placed, a second surface which is opposite to the first surface, and a side wall of the back cavity,
wherein a first venting hole of the at least two venting holes is provided on the side wall of the back cavity, a second venting hole of the at least two venting holes is provided on the first surface or the second surface, and the first venting hole communicates with the second venting hole to form an air flow path, and the air flow path passes by the transducer member.

2. The transducer module according to claim 1, wherein the transducer module is a speaker module and the transducer member is a diaphragm of the speaker module.

3. The transducer module according to claim 1, wherein at least one venting hole of the two venting holes is covered by a mesh.

4. The transducer module according to claim 1, wherein at least one venting hole of the two venting holes is provided with a shelter, which prevents the venting hole from direct communication with an outside space.

5. The transducer module according to claim 1, wherein the two venting holes are displaced on a projection plane containing the surface where one of the two venting holes is located.

6. An electronics device, comprising the transducer module according to claim 1.

7. The electronics device according to claim 6, further comprising a heat sink and a heat generation component arranged near the heat sink.

8. The electronics device according 7, wherein a first venting hole of the at least two venting holes is placed towards the heat sink.

9. The electronics device according to claim 8, wherein the second venting hole of at least the two venting holes is provided at a bottom surface of the transducer module.

* * * * *